United States Patent
Igari

(10) Patent No.: US 12,413,194 B2
(45) Date of Patent: Sep. 9, 2025

(54) DIGITAL POWER AMPLIFIER, SPEAKER DRIVE SYSTEM, AND SPEAKER DRIVE METHOD

(71) Applicant: JVCKENWOOD CORPORATION, Yokohama (JP)

(72) Inventor: Toshifumi Igari, Yokohama (JP)

(73) Assignee: JVCKENWOOD CORPORATION, Yokohama (JP)

( * ) Notice: Subject to any disclaimer, the term of this patent is extended or adjusted under 35 U.S.C. 154(b) by 207 days.

(21) Appl. No.: 18/369,131

(22) Filed: Sep. 15, 2023

(65) Prior Publication Data
US 2024/0007068 A1  Jan. 4, 2024

Related U.S. Application Data

(63) Continuation of application No. PCT/JP2021/046715, filed on Dec. 17, 2021.

(30) Foreign Application Priority Data

Mar. 15, 2021 (JP) ................... 2021-041040

(51) Int. Cl.
*H03F 3/45* (2006.01)
*H04R 3/04* (2006.01)

(52) U.S. Cl.
CPC .......... *H03F 3/45475* (2013.01); *H04R 3/04* (2013.01); *H03F 2200/03* (2013.01); *H03F 2200/171* (2013.01)

(58) Field of Classification Search
CPC .... H03F 9/00; H03F 3/45475; H03F 2200/03; H03F 2200/171; H03F 3/183;
(Continued)

(56) References Cited

U.S. PATENT DOCUMENTS 7,924,091 B2 * 4/2011 Horbach ................. H03F 3/217
                                                      330/251
9,647,612 B2 * 5/2017 Watanabe ............. H03F 3/2178
(Continued)

FOREIGN PATENT DOCUMENTS

| JP | 2016-072876 A | 5/2016 |
| JP | 2016-072877 A | 5/2016 |
| JP | 2018-088575 A | 6/2018 |

OTHER PUBLICATIONS

Written Opinion dated Mar. 22, 2022 issued in corresponding International Application No. PCT/JP2021/046715.

*Primary Examiner* — Xu Mei
(74) *Attorney, Agent, or Firm* — Nath, Goldberg & Meyer; Jerald L. Meyer

(57) ABSTRACT

An operational amplifier outputs a signal obtained by integrating a sum of a first audio signal that is input to an inverting input terminal and a feedback signal that is output from a power amplifier. A pulse width modulator pulse-width modulates an output of the operational amplifier to generate a PWM signal. A demodulator demodulates the PWM signal to generate a second audio signal that is supplied to a speaker including an audio signal band and a high frequency band of the PWM signal that exceeds the audio signal band. A high pass filter removes low frequency components in a current of the second audio signal including the audio signal band. A current feedback circuit feeds back a current component of the second audio signal from which the low frequency components have been removed, so as to be added to the first audio signal.

4 Claims, 5 Drawing Sheets

(58) Field of Classification Search
CPC ........... H03F 3/217; H03F 1/52; H03G 3/005;
H04R 3/04; H04R 3/002
USPC ............ 381/98, 117, 120, 121; 330/10, 251,
330/207 A, 102, 103
See application file for complete search history.

(56) References Cited

U.S. PATENT DOCUMENTS

| | | | |
|---|---|---|---|
| 9,647,614 B2* | 5/2017 | Otani | H03F 3/185 |
| 11,309,853 B1* | 4/2022 | Peterson | H03F 1/342 |
| 2019/0222182 A1* | 7/2019 | Togawa | H03F 3/217 |
| 2020/0153396 A1* | 5/2020 | Nakahira | H03K 7/08 |

* cited by examiner

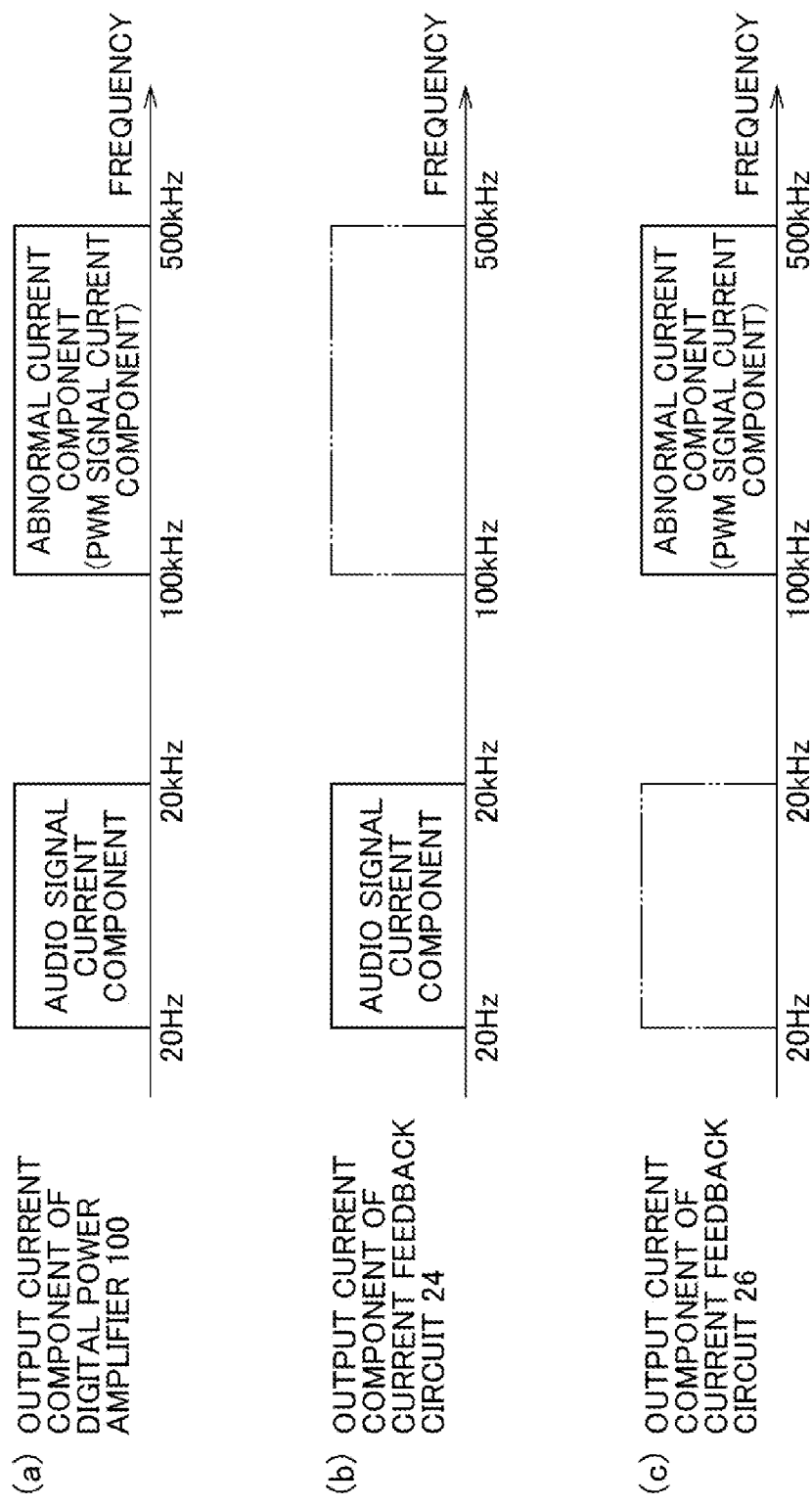

DIGITAL POWER AMPLIFIER, SPEAKER DRIVE SYSTEM, AND SPEAKER DRIVE METHOD

CROSS REFERENCE TO RELATED APPLICATION

This application is a continuation of PCT Application No. PCT/JP2021/046715, filed on Dec. 17, 2021, and claims the priority of Japanese Patent Application No. 2021-041040, filed on Mar. 15, 2021, the entire contents of both of which are incorporated herein by reference.

BACKGROUND

The present disclosure relates to a digital power amplifier, a speaker drive system, and a speaker drive method.

As disclosed in Japanese Unexamined Patent Application Publication No. 2016-72876 (Patent Document 1), a digital power amplifier equipped with a pulse width modulator modulates an input analog audio signal into a digital pulse width modulation signal (PWM signal), amplifies it, and then demodulates it into an analog audio signal to drive a speaker. As an example, in a broadcasting facility where audio signals are supplied to a plurality of speakers to output predetermined sounds, a plurality of parallel-connected speakers may be driven by a plurality of parallel-connected digital power amplifiers.

SUMMARY

When a plurality of digital power amplifiers are connected in parallel, if the voltage gain of each digital power amplifier is not the same, an abnormal current flows between the plurality of digital power amplifiers. In Patent Document 1, the abnormal current flow is prevented by providing a voltage feedback circuit and a current feedback circuit that, respectively, feed back the voltage and current of low frequency components including an audio signal band in the amplified audio signal.

However, the configuration described in Patent Document 1 can only prevent an abnormal current in the audio signal band from flowing. Verification by the present inventor has revealed that an abnormal current flows in a high frequency band that exceeds the audio signal band between a plurality of digital power amplifiers connected in parallel, and that the abnormal current flowing in the high frequency band may cause various problems.

A first aspect of one or more embodiments provides a digital power amplifier including: an operational amplifier in which an analog first audio signal is input to an inverting input terminal; a pulse width modulator configured to generate a pulse width modulation signal based on an output of the operational amplifier; a power amplifier configured to amplify power of the pulse width modulation signal; and a feedback circuit configured to feed back an output of the power amplifier to the inverting input terminal, wherein the operational amplifier is configured to perform a self-oscillating operation by feeding back a feedback signal from the feedback circuit to the inverting input terminal, the pulse width modulator is configured to pulse-width modulate a signal obtained by integrating a sum of the first audio signal and the feedback signal by means of the operational amplifier, thereby generating a pulse width modulation signal for the self-oscillating operation, and the digital power amplifier further includes: a demodulator configured to demodulate the pulse width modulation signal that is output from the power amplifier, and to generate an analog second audio signal that is supplied to a speaker including an audio signal band and a high frequency band of the pulse width modulation signal that exceeds the audio signal band; a high pass filter configured to remove low frequency components including the audio signal band in a current of the second audio signal; and a first current feedback circuit configured to feed back a current component of the second audio signal from which the low frequency components have been removed, so as to be added to the first audio signal.

A second aspect of one or more embodiments provides a speaker drive system including: a plurality of digital power amplifiers connected in parallel, at least one speaker connected to the plurality of digital power amplifiers connected in parallel, wherein each digital power amplifier includes: an operational amplifier in which an analog first audio signal is input to an inverting input terminal; a pulse width modulator configured to generate a pulse width modulation signal based on an output of the operational amplifier; a power amplifier configured to amplify power of the pulse width modulation signal; and a feedback circuit configured to feed back an output of the power amplifier to the inverting input terminal, wherein the operational amplifier is configured to perform a self-oscillating operation by feeding back a feedback signal from the feedback circuit to the inverting input terminal, the pulse width modulator is configured to pulse-width modulate a signal obtained by integrating a sum of the first audio signal and the feedback signal by means of the operational amplifier, thereby generating a pulse width modulation signal for the self-oscillating operation, and each digital power amplifier further includes: a demodulator configured to demodulate the pulse width modulation signal that is output from the power amplifier, and to generate an analog second audio signal that is supplied to a speaker including an audio signal band and a high frequency band of the pulse width modulation signal that exceeds the audio signal band; a high pass filter configured to remove low frequency components including the audio signal band in a current of the second audio signal; and a first current feedback circuit configured to feed back a current component of the second audio signal from which the low frequency components have been removed, so as to be added to the first audio signal.

A third aspect of one or more embodiments provides a speaker drive method including: inputting an analog first audio signal to an inverting input terminal of an operational amplifier; using a pulse width modulator to generate a pulse width modulation signal based on an output of the operational amplifier; using a power amplifier to amplify power of the pulse width modulation signal; using a feedback circuit to feed back an output of the power amplifier to the inverting input terminal; using the operational amplifier to perform a self-oscillating operation by feeding back a feedback signal from the feedback circuit to the inverting input terminal; using the pulse width modulator to generate a pulse width modulation signal for the self-oscillating operation by performing pulse width modulation on a signal obtained by integrating a sum of the first audio signal and the feedback signal by means of the operational amplifier; using a demodulator to demodulate the pulse width modulation signal that is output from the power amplifier to generate an analog second audio signal that is supplied to a speaker including an audio signal band and a high frequency band of the pulse width modulation signal that exceeds the audio signal band; using a current detection circuit to detect a current of the second audio signal; using a high pass filter to remove low frequency components in a current of the second audio signal including the audio signal band; and using a current feedback circuit to feed back a current component of the second audio signal from which the low frequency components have been removed, so as to be added to the first audio signal.

BRIEF DESCRIPTION OF THE DRAWINGS

FIG. 7 is a diagram illustrating frequency bands of an output current component of the digital power amplifier 100 and output current components of the current feedback circuits 24 and 26.

DETAILED DESCRIPTION

A digital power amplifier, a speaker drive system, and a speaker drive method according to one or more embodiments will be described below with reference to the accompanying drawings.

Figure 1:
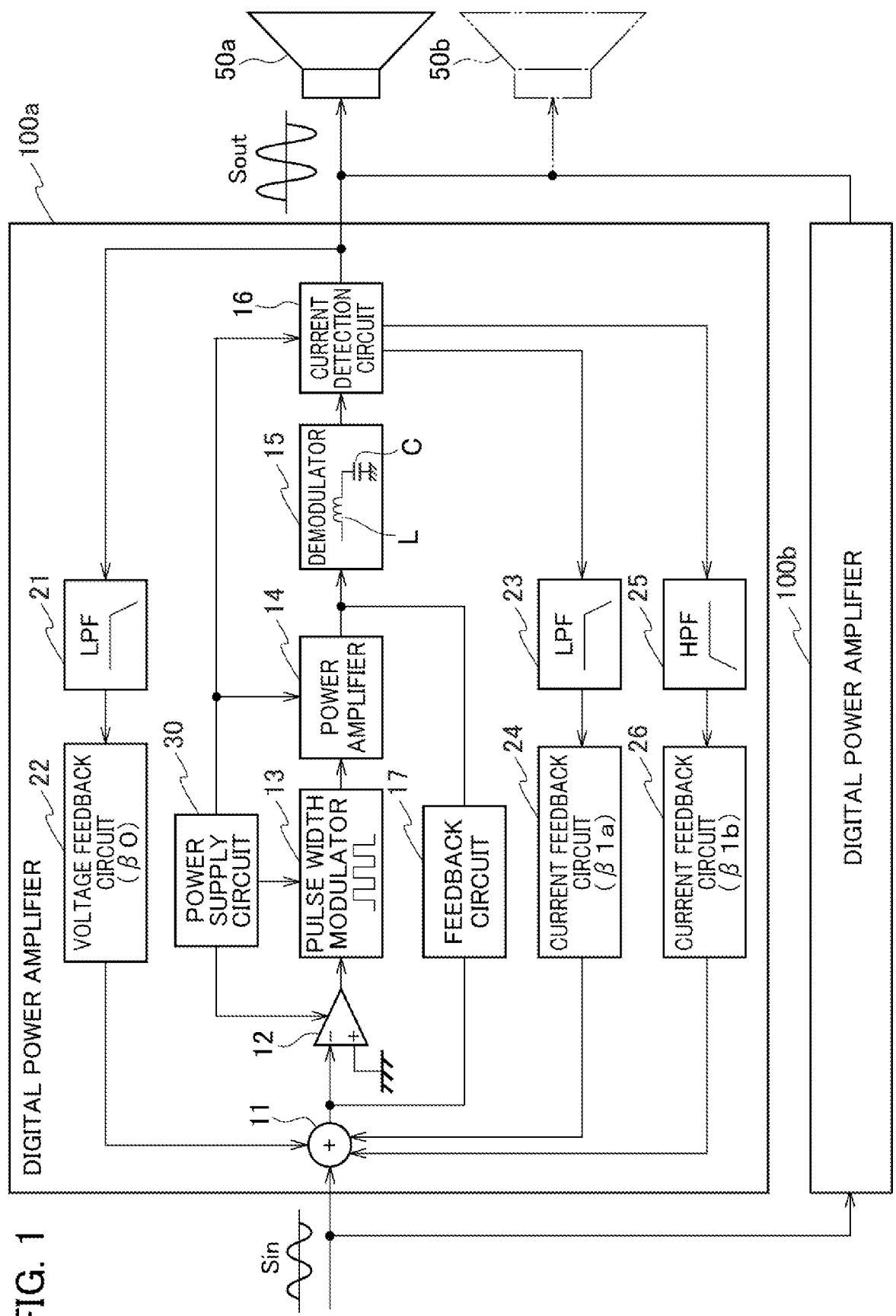
FIG. 1 is a block diagram illustrating a digital power amplifier and a speaker drive system according to one or more embodiments.

In FIG. 1, two digital power amplifiers 100a and 100b are connected in parallel, and a speaker 50a is connected to the digital power amplifiers 100a and 100b. Any digital power amplifier including the digital power amplifiers 100a and 100b will be referred to as a digital power amplifier 100. Three or more digital power amplifiers 100 may be connected in parallel. A plurality of digital power amplifiers 100 connected in parallel constitute a speaker drive system.

Although only one speaker 50a is connected to the digital power amplifiers 100a and 100b in FIG. 1, a speaker 50b may be connected in parallel with the speaker 50a. Any speaker including speakers 50a and 50b will be referred to as a speaker 50. Three or more speakers 50 may be connected in parallel to the digital power amplifiers 100a and 100b.

The digital power amplifier 100 shown in FIG. 1 is called a high impedance amplifier. A required number of digital power amplifiers 100 may be connected in parallel according to the number of speakers 50. At least one speaker 50 may be connected to a plurality of digital power amplifiers 100 connected in parallel.

The configuration and operation of the digital power amplifier 100b are the same as the configuration and operation of the digital power amplifier 100a. As a representative example, the configuration and operation of the digital power amplifier 100a will be described.

As shown in FIG. 1, the digital power amplifier 100a includes an adder 11, an operational amplifier 12, a feedback circuit 17, a pulse width modulator 13, a power amplifier 14, a demodulator 15, a current detection circuit 16, and a power supply circuit 30. In addition, the digital power amplifier 100a includes a low pass filter 21 (hereinafter, LPF 21), a voltage feedback circuit 22, a low pass filter 23 (hereinafter, LPF 23), a current feedback circuit 24, a high pass filter 25 (hereinafter, HPF 25), and a current feedback circuit 26.

The LPF 21 is a first low pass filter, and the LPF 23 is a second low pass filter. The current feedback circuit 26 is a first current feedback circuit, and the current feedback circuit 24 is a second current feedback circuit.

The power supply circuit 30, which is connected to an unillustrated commercial power supply, supplies power to the operational amplifier 12, pulse width modulator 13, power amplifier 14, and current detection circuit 16.

An analog audio signal Sin (a first audio signal) is input to the adder 11. The adder 11 adds the voltage feedback signal from the voltage feedback circuit 22 and the current feedback signals from the current feedback circuits 24 and 26, and supplies the result to an inverting input terminal of the operational amplifier 12. A non-inverting input terminal of the operational amplifier 12 is grounded. The pulse width modulator 13 generates and outputs a digital pulse width modulation signal (PWM signal) having a duty ratio corresponding to the amplitude of the analog signal that is output from the operational amplifier 12. The pulse width modulator 13 supplies the PWM signal to the power amplifier 14.

The operational amplifier 12 constitutes an integrating circuit. By feeding back the output of the power amplifier 14 to the inverting input terminal of the operational amplifier 12 by means of the feedback circuit 17, the operational amplifier 12 performs a self-oscillating operation. The operational amplifier 12 integrates the sum of the audio signal Sin input to the inverting input terminal and the feedback signal obtained by feeding back the output of the power amplifier 14 to the inverting input terminal by means of the feedback circuit 17. The pulse width modulator 13 pulse-width modulates the integrated signal to generate a PWM signal for the self-oscillating operation. As long as power is supplied from the power supply circuit 30, the pulse width modulator 13 generates a PWM signal even if the audio signal Sin is not input to the adder 11, or the speaker 50 is not connected.

Figure 2:
FIG. 2 is a characteristic diagram illustrating the relationship between duty ratio and a self-excited frequency when the pulse width modulator 13 shown in FIG. 1 generates a PWM signal.

The pulse width modulator 13 generates a PWM signal with a duty ratio of 50% when no analog signal is input from the operational amplifier 12, that is, when the amplitude of the analog signal is zero. The pulse width modulator 13 generates a PWM signal with a duty ratio increased or decreased from the duty ratio of 50% according to an increase or a decrease in the amplitude of the input analog signal. As shown in FIG. 2 as an example, the self-oscillating pulse width modulator 13 generates a PWM signal with a self-excited frequency according to the duty ratio. In the example shown in FIG. 2, the self-excited frequency varies from 100 kHz to 500 kHz.

Returning to FIG. 1, the power amplifier 14 amplifies the power of the PWM signal supplied from the pulse width modulator 13 and supplies it to the demodulator 15. The demodulator 15 includes a low pass filter (LPF) with an inductor L and a capacitor C. The inductor L is connected in series between the power amplifier 14 and the current detection circuit 16, and the capacitor C includes one terminal connected to the output stage of the inductor L and the other terminal grounded. The demodulator 15 removes high frequency components from the input digital signal and demodulates it into an analog signal.

The analog signal that is output from the demodulator 15 is supplied to the speaker 50a as an analog audio signal Sout (a second audio signal) via the current detection circuit 16. In this way, the digital power amplifier 100a converts the input analog audio signal Sin into a digital PWM signal, amplifies it, and demodulates it into the analog audio signal Sout to drive the speaker 50a. As will be described later, the audio signal Sout includes an audio signal band and a high frequency band of the PWM signal exceeding the audio signal band that could not be removed by the demodulator 15.

The digital power amplifier 100a includes the voltage feedback circuit 22 and the current feedback circuit 24 to improve audio performance and circuit stability. Note that improving audio performance includes at least one of suppressing fluctuations in output voltage, reducing a distortion factor, and reducing noise. The LPF 21 removes high frequency components from the voltage of the audio signal Sout after passing through the current detection circuit 16, and supplies the voltage of the audio signal Sout to the voltage feedback circuit 22. The voltage feedback circuit 22 feeds back the voltage component from which the high frequency components have been removed, to the adder 11 so as to add it to the audio signal Sin.

The current detection circuit 16 detects the current of the audio signal Sout. The LPF 23 removes the high frequency components of the current of the audio signal Sout detected by the current detection circuit 16, and supplies the current of the audio signal Sout to the current feedback circuit 24. The current feedback circuit 24 feeds back the current component from which the high frequency components have been removed, to the adder 11 so as to add it to the audio signal Sin.

Suppose that the amount of voltage feedback by the voltage feedback circuit 22 is $\beta 0$, and the amount of current feedback by the current feedback circuit 24 is $\beta 1a$, and that the output current of the digital power amplifier 100 (100a and 100b) is Io, and the output voltage is Vo. When the voltage feedback amount $\beta 0$ and the current feedback amount $\beta 1a$ are changed, the relationship between the output current Io and the output voltage Vo changes as shown in FIG. 3.

Figure 3:
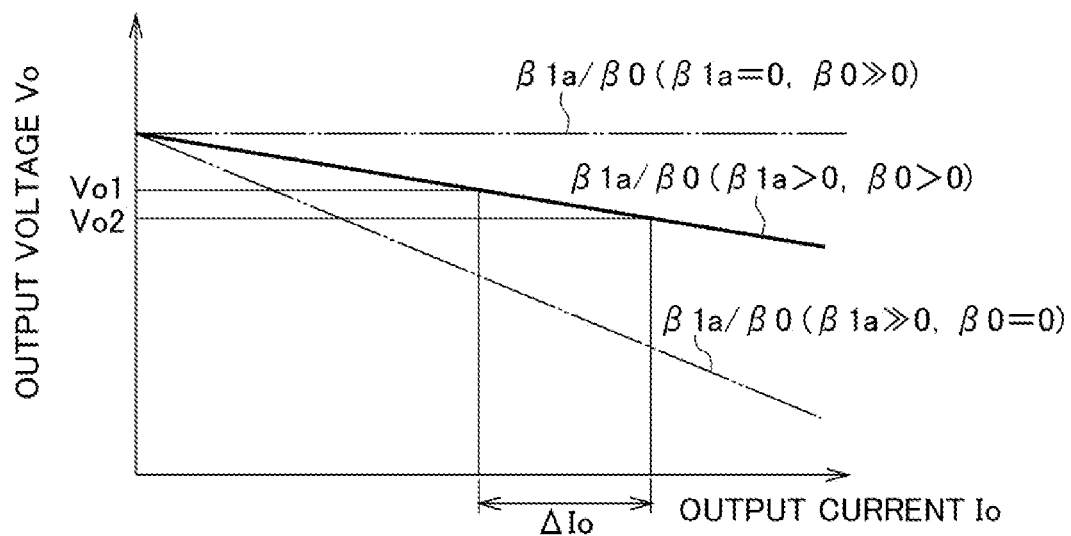
FIG. 3 is a characteristic diagram illustrating the relationship between the output current Io and the output voltage Vo of the digital power amplifier 100 when the voltage feedback amount β0 of the voltage feedback circuit 22 and the current feedback amount β1a of the current feedback circuit 24 shown in FIG. 1 are changed.

As shown in FIG. 3, when the current feedback amount $\beta 1a$ is reduced $\beta 0$, for example) and the voltage feedback amount $\beta 0$ is increased to cause strong voltage feedback by the voltage feedback circuit 22, the fluctuation of the output voltage Vo is eliminated and audio performance can be further improved. At this time, the stability of the parallel connection operation of the digital power amplifiers 100 deteriorates. When the voltage feedback amount $\beta 0$ is reduced (0, for example) and the current feedback amount $\beta 1a$ is increased to strongly operate the current feedback by the current feedback circuit 24, the fluctuation of the output current Io is eliminated and the parallel connection operation of the digital power amplifiers 100 can be improved. At this time, the degree of improvement in audio performance deteriorates.

Thus, the effect of the voltage feedback operation by the voltage feedback circuit 22 and the effect of the current feedback operation by the current feedback circuit 24 are in a trade-off relationship.

When the voltage gains of the digital power amplifiers 100a and 100b are not the same, and the output voltages Vo of the digital power amplifiers 100a and 100b are Vo1 and Vo2, respectively, an output current fluctuation width $\Delta$Io occurs in the output current Io. Then, an abnormal current flows between the digital power amplifiers 100a and 100b in the audio signal band. The larger the slope between the output current Io and the output voltage Vo, the smaller the output current fluctuation width $\Delta$Io, and although the abnormal current in the audio signal band can be suppressed, the degree of improvement in audio performance deteriorates.

Therefore, as shown by the solid line in FIG. 3, it is preferable to set the slope (ratio of $\beta 1a/\beta 0$) between the output current Io and the output voltage Vo to an appropriate slope (appropriate ratio), by setting the current feedback amount $\beta 1a$ and the voltage feedback amount $\beta 0$ to predetermined values exceeding 0. In the digital power amplifier 100, the optimal value of the ratio of $\beta 1a/\beta 0$ is set to achieve both improved audio performance and improved stability of the parallel connection operation of the digital power amplifiers 100 while suppressing the abnormal current in the audio signal band as much as possible.

However, verification by the present inventor has revealed that even if the abnormal current in the audio signal band is suppressed, an abnormal current may flow in the high frequency band exceeding the audio signal band between a plurality of digital power amplifiers 100 connected in parallel, and the abnormal current in the high frequency band may cause various problems. The abnormal current flowing in a high frequency band may cause problems such as deteriorating the efficiency of amplification of the audio signal Sin by the digital power amplifier 100, deteriorating audio performance, shortening the life of the device by the heating of circuit elements, and increasing the risk of destruction of the device.

Figure 4:
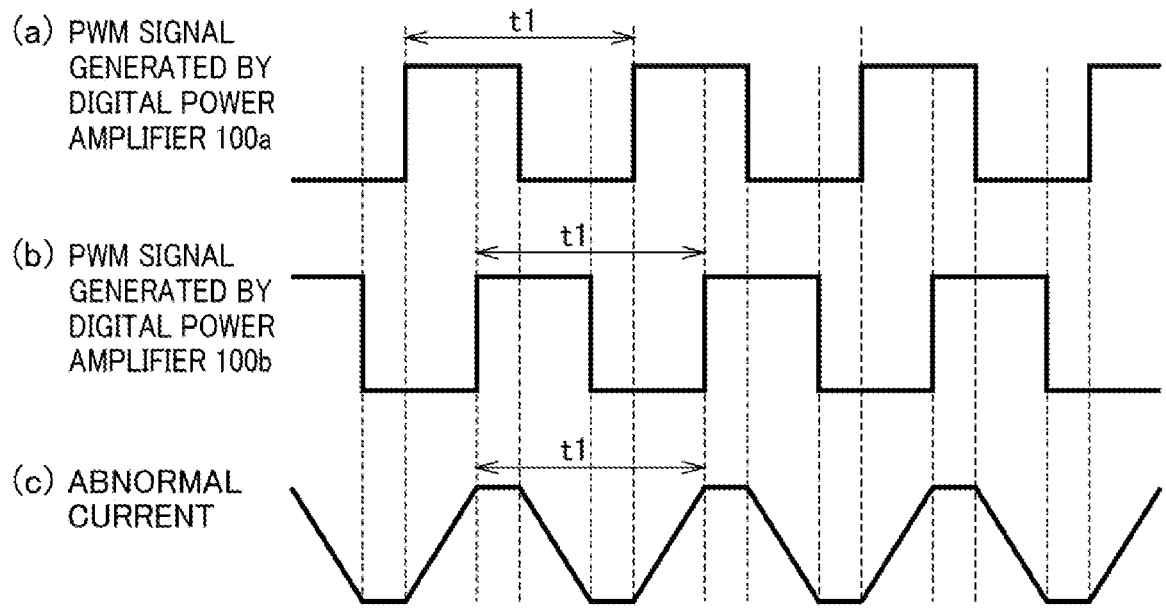
FIG. 4 is a waveform diagram illustrating a first example of PWM signals generated by the digital power amplifiers 100a and 100b shown in FIG. 1 and an abnormal current at that time.

In FIG. 4, (a) and (b) show a first example of PWM signals generated by the digital power amplifiers 100a and 100b, respectively. The periods of the PWM signals generated by the digital power amplifiers 100a and 100b are both t1, and their frequencies match. However, the PWM signals generated by the digital power amplifiers 100a and 100b are out of phase.

In this case, an abnormal current shown in (c) of FIG. 4 flows between the digital power amplifiers 100a and 100b in a high frequency band exceeding the audio signal band. The abnormal current has a period t1 and alternately flows from the digital power amplifier 100a to the digital power amplifier 100b and from the digital power amplifier 100b to the digital power amplifier 100a.

Figure 5:
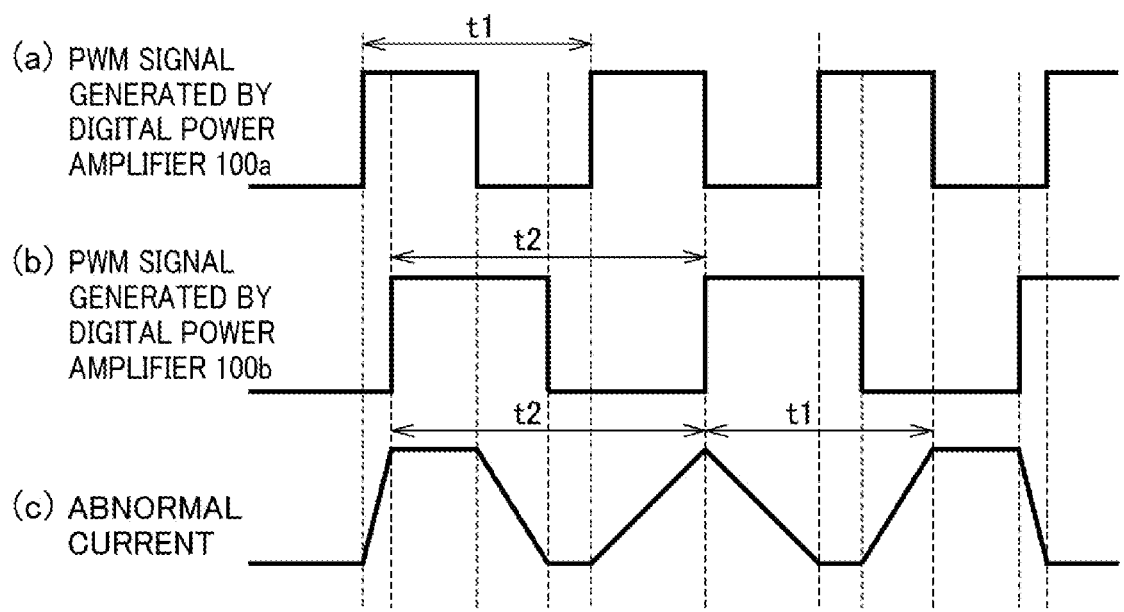
FIG. 5 is a waveform diagram illustrating a second example of PWM signals generated by the digital power amplifiers 100a and 100b shown in FIG. 1 and an abnormal current at that time.

In FIG. 5, (a) and (b) show a second example of PWM signals generated by the digital power amplifiers 100a and 100b, respectively. The period of the PWM signal generated by the digital power amplifiers 100a is t1, the period of the PWM signal generated by the digital power amplifiers 100b is t2, and their frequencies are different from each other.

In this case as well, an abnormal current shown in (c) of FIG. 5 flows between the digital power amplifiers 100a and 100b in the high frequency band exceeding the audio signal band. The abnormal current has periods that alternate between a period t1 and a period t2, and alternately flows from the digital power amplifier 100a to the digital power amplifier 100b and from the digital power amplifier 100b to the digital power amplifier 100a.

In this way, if a phase or frequency difference exists in the PWM signals generated by the digital power amplifiers 100*a* and 100*b* connected in parallel, an abnormal current flows between the digital power amplifiers 100 connected in parallel in the high frequency band derived from the PWM signals. As long as power is supplied from the power supply circuit 30, the abnormal current flows between the digital power amplifiers 100 connected in parallel even if the audio signal Sin is not input to the adder 11, or even if the speaker 50 is not connected.

Therefore, as shown in FIG. 1, the digital power amplifier 100*a* is provided with the current feedback circuit 26 for suppressing the abnormal current in the high frequency band derived from the PWM signal. Suppose that the amount of current feedback by the current feedback circuit 26 is β1*b*. The current of the audio signal Sout detected by the current detection circuit 16 has its low frequency components removed by the HPF 25, and is fed back to the adder 11 by the current feedback circuit 26. As described above, the frequency of the PWM signal generated by the pulse width modulator 13 is in the range of 100 kHz to 500 kHz, and the frequency of the abnormal current is the same as that of the PWM signal. The HPF 25 passes a frequency band of 100 kHz to 500 kHz.

Figure 6:
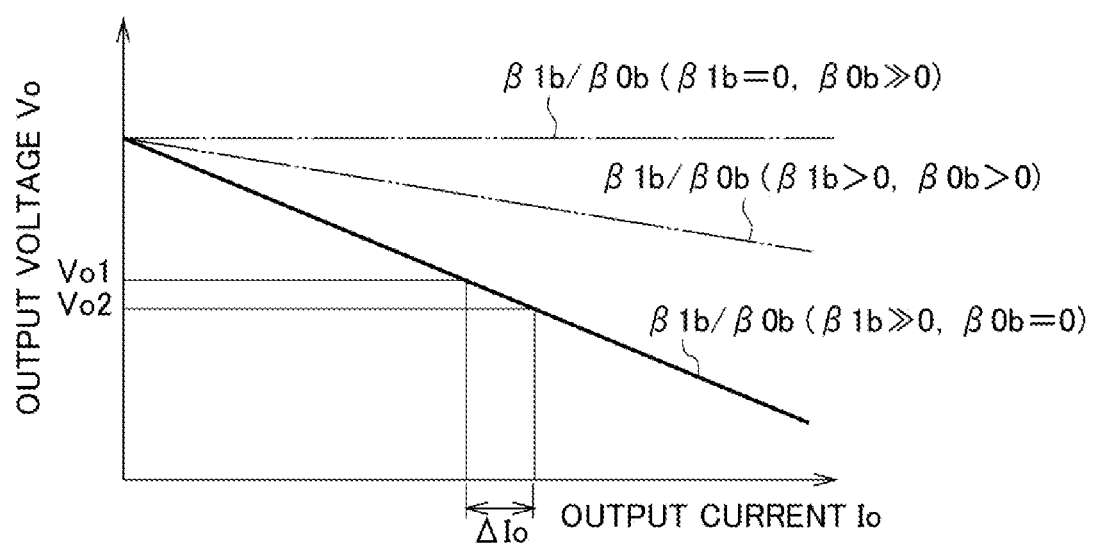
FIG. 6 is characteristic diagram illustrating the relationship between the output current Io and the output voltage Vo of the digital power amplifier 100 supposing that a voltage feedback circuit is provided that feeds back a voltage with a voltage feedback amount β0b in a high frequency band in FIG. 1, and the voltage feedback amount β0b and the current feedback amount β1b of the voltage feedback circuit 26 are changed.

In FIG. 1, there is no voltage feedback circuit that feeds back the voltage in the high frequency band, but suppose that the voltage is fed back with the voltage feedback amount β0*b* in the high frequency band. When the voltage feedback amount β0*b* and the current feedback amount β1*b* are changed, the relationship between the output current Io and the output voltage Vo changes as shown in FIG. 6 similar to FIG. 3. Similar to the above, if the current feedback by the current feedback circuit 26 is made to be strong by increasing the current feedback amount β1*b*, the degree of improvement in audio performance is deteriorated, but the stability of the parallel connection operation of the digital power amplifiers 100 can be improved.

However, since there is no audio signal in the high frequency band exceeding the audio signal band, it is not necessary to consider deterioration in the degree of improvement in audio performance. That is, as indicated by the solid line in FIG. 6, it is only necessary to consider increasing the current feedback amount β1*b* by the current feedback circuit 26 to improve the stability of the parallel connection operation. Therefore, the current feedback circuit 26 increases the current feedback amount β1*b* to strongly operate the current feedback. The current feedback amount β1*b* in the current feedback circuit 26 is larger than the current feedback amount β1*a* in the current feedback circuit 24.

Suppose that the PWM signals generated by the digital power amplifiers 100*a* and 100*b* connected in parallel have a phase difference or a frequency difference, and the output voltages Vo of the digital power amplifiers 100*a* and 100*b* are Vo1 and Vo2, respectively. At this time, if the current feedback in the high frequency band is strongly operated, the output current fluctuation width ΔIo can be reduced as shown in FIG. 6. Therefore, an abnormal current in a high frequency band can be suppressed.

The operation of the digital power amplifier 100 will be described with reference to FIG. 7. As shown in (a) of FIG. 7, the output current Io of the digital power amplifier 100 includes an audio signal current component in the audio signal band of 20 Hz to 20 kHz and an abnormal current component of 100 kHz to 500 kHz, for example. An audio signal current component may include an abnormal current in the audio signal band. A current component of the PWM signal is also present between 100 kHz and 500 kHz. Note that the current component and the abnormal current component of the PWM signal are present at one of the frequencies in the frequency range of 100 kHz to 500 kHz.

The LPF 23 removes the high frequency components and supplies a frequency band including the audio signal band of 20 Hz to 20 kHz to the current feedback circuit 24. Therefore, as shown in (b) of FIG. 7, the current feedback circuit 24 feeds back the audio signal current component to the adder 11. The HPF 25 removes the low frequency components and provides a frequency band including 100 kHz to 500 kHz to the current feedback circuit 26. Therefore, as shown in (c) of FIG. 7, the current feedback circuit 24 feeds back the abnormal current component of 100 Hz to 500 kHz to the adder 11.

Due to the current feedback circuit 26 feeds back the abnormal current component to the adder 11, the phase shift of the PWM signals generated by the digital power amplifiers 100*a* and 100*b* of the self-oscillating PWM modulation system is eliminated, the frequency mismatch is eliminated, and the abnormal current component is suppressed. Therefore, according to the digital power amplifier 100, it is possible to reduce the occurrence of defects due to the abnormal current flowing in a high frequency band.

The voltage feedback circuit 22 and the current feedback circuit 24 improve audio performance, and suppress the abnormal current in the audio signal band that occurs when the voltage gain of each digital power amplifier 100 is not the same when a plurality of digital power amplifiers 100 are connected in parallel. If the audio performance improvement is not required and the voltage gain can be adjusted and managed so that the voltage gain difference of each digital power amplifier 100 does not occur, the digital power amplifier 100 does not need to be provided with the LPF 21, voltage feedback circuit 22, LPF 23, and current feedback circuit 24. That is, the digital power amplifier 100 may include only the HPF 25 and current feedback circuit 26 as feedback circuits.

Incidentally, a transformer can be provided at the output of the digital power amplifier 100 to prevent an abnormal current in a high frequency band exceeding the audio signal band from flowing between a plurality of digital power amplifiers 100 connected in parallel. In this case, a large-sized and expensive transformer for high power is required. Therefore, if the digital power amplifier 100 is equipped with a high-power transformer, the device will be large and expensive. According to the configuration of one or more embodiments shown in FIG. 1, it is possible to prevent abnormal currents flowing in high frequency bands exceeding the audio signal band from flowing between a plurality of digital power amplifiers 100 connected in parallel, without increasing the size of the device and at a low cost.

The present invention is not limited to one or more embodiments described above, and various modifications can be made without departing from the scope of the present invention.

What is claimed is:

1. A digital power amplifier comprising:
   an operational amplifier in which an analog first audio signal is input to an inverting input terminal;
   a pulse width modulator configured to generate a pulse width modulation signal based on an output of the operational amplifier;
   a power amplifier configured to amplify power of the pulse width modulation signal; and
   a feedback circuit configured to feed back an output of the power amplifier to the inverting input terminal, wherein the operational amplifier is configured to perform a self-oscillating operation by feeding back a feedback signal from the feedback circuit to the inverting input terminal, the pulse width modulator is configured to pulse-width modulate a signal obtained by integrating a sum of the first audio signal and the feedback signal by means of the operational amplifier, thereby generating a pulse width modulation signal for the self-oscillating operation, and the digital power amplifier further comprises:

a demodulator configured to demodulate the pulse width modulation signal that is output from the power amplifier, and to generate an analog second audio signal that is supplied to a speaker including an audio signal band and a high frequency band of the pulse width modulation signal that exceeds the audio signal band;

a high pass filter configured to remove low frequency components including the audio signal band in a current of the second audio signal; and a first current feedback circuit configured to feed back a current component of the second audio signal from which the low frequency components have been removed, so as to be added to the first audio signal.

2. The digital power amplifier according to claim 1, further comprising:

a first low pass filter configured to remove high frequency components including the high frequency band in a voltage of the second audio signal;

a voltage feedback circuit configured to feed back a voltage component of the second audio signal from which the high frequency components have been removed, so as to be added to the first audio signal;

a second low pass filter configured to remove high frequency components including the high frequency band in a current of the second audio signal;

a second current feedback circuit configured to feed back a current component of the second audio signal from which the high frequency components have been removed, so as to be added to the first audio signal, wherein an amount of current feedback performed by the first current feedback circuit is larger than an amount of current feedback performed by the second current feedback circuit.

3. A speaker drive system comprising:

a plurality of digital power amplifiers connected in parallel, at least one speaker connected to the plurality of digital power amplifiers connected in parallel, wherein each digital power amplifier comprises:

an operational amplifier in which an analog first audio signal is input to an inverting input terminal;

a pulse width modulator configured to generate a pulse width modulation signal based on an output of the operational amplifier;

a power amplifier configured to amplify power of the pulse width modulation signal; and a feedback circuit configured to feed back an output of the power amplifier to the inverting input terminal, wherein the operational amplifier is configured to perform a self-oscillating operation by feeding back a feedback signal from the feedback circuit to the inverting input terminal, the pulse width modulator is configured to pulse-width modulate a signal obtained by integrating a sum of the first audio signal and the feedback signal by means of the operational amplifier, thereby generating a pulse width modulation signal for the self-oscillating operation, and each digital power amplifier further comprises:

a demodulator configured to demodulate the pulse width modulation signal that is output from the power amplifier, and to generate an analog second audio signal that is supplied to a speaker including an audio signal band and a high frequency band of the pulse width modulation signal that exceeds the audio signal band;

a high pass filter configured to remove low frequency components including the audio signal band in a current of the second audio signal; and a first current feedback circuit configured to feed back a current component of the second audio signal from which the low frequency components have been removed, so as to be added to the first audio signal.

4. A speaker drive method comprising:

inputting an analog first audio signal to an inverting input terminal of an operational amplifier;

using a pulse width modulator to generate a pulse width modulation signal based on an output of the operational amplifier;

using a power amplifier to amplify power of the pulse width modulation signal;

using a feedback circuit to feed back an output of the power amplifier to the inverting input terminal;

using the operational amplifier to perform a self-oscillating operation by feeding back a feedback signal from the feedback circuit to the inverting input terminal;

using the pulse width modulator to generate a pulse width modulation signal for the self-oscillating operation by performing pulse width modulation on a signal obtained by integrating a sum of the first audio signal and the feedback signal by means of the operational amplifier;

using a demodulator to demodulate the pulse width modulation signal that is output from the power amplifier to generate an analog second audio signal that is supplied to a speaker including an audio signal band and a high frequency band of the pulse width modulation signal that exceeds the audio signal band;

using a current detection circuit to detect a current of the second audio signal;

using a high pass filter to remove low frequency components in a current of the second audio signal including the audio signal band; and using a current feedback circuit to feed back a current component of the second audio signal from which the low frequency components have been removed, so as to be added to the first audio signal.

* * * * *